United States Patent
Liu et al.

(10) Patent No.: US 12,409,797 B2
(45) Date of Patent: Sep. 9, 2025

(54) SNAP ON CURRENT SENSOR DESIGN

(71) Applicant: Suzhou Littelfuse OVS Co., Ltd., Suzhou (CN)

(72) Inventors: Rex Liu, Suzhou (CN); Sunny Pan, Suzhou (CN); Vector Li, Suzhou (CN)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 132 days.

(21) Appl. No.: 17/899,878

(22) Filed: Aug. 31, 2022

(65) Prior Publication Data

US 2023/0083624 A1 Mar. 16, 2023

(51) Int. Cl.
*H05K 5/02* (2006.01)
*B60R 16/023* (2006.01)

(52) U.S. Cl.
CPC ................ *B60R 16/0239* (2013.01)

(58) Field of Classification Search
CPC .................................. B60R 16/0239
USPC ................. 361/752, 728, 796, 800
See application file for complete search history.

(56) References Cited

U.S. PATENT DOCUMENTS

| | | | |
|---|---|---|---|
| 5,621,191 A * | 4/1997 | Norris .................. | H02G 3/0675 174/653 |
| 2002/0101041 A1* | 8/2002 | Kameyama ......... | H01R 13/521 277/628 |
| 2002/0126457 A1* | 9/2002 | Kameyama ............ | H05K 7/026 361/728 |
| 2006/0099842 A1* | 5/2006 | Hayashi ............. | H01R 13/6272 439/271 |
| 2009/0258522 A1* | 10/2009 | Bracci ................ | H01R 13/5205 439/279 |
| 2012/0024590 A1 | 2/2012 | Chiou | |
| 2014/0011401 A1* | 1/2014 | Endo .................. | H01R 13/5205 439/588 |
| 2015/0222107 A1* | 8/2015 | Jackson ............... | H02G 15/046 174/142 |

FOREIGN PATENT DOCUMENTS

| | | |
|---|---|---|
| EP | 3800752 A4 | 8/2021 |
| JP | H0714520 U | 3/1995 |
| JP | H11341645 A | 12/1999 |
| JP | 2002112438 A | 4/2002 |
| JP | 2003009361 A | 1/2003 |
| JP | 2012130185 A | 7/2012 |
| JP | 2013531332 A | 8/2013 |
| JP | 2018098829 A | 6/2018 |

(Continued)

OTHER PUBLICATIONS

European Search Report and Written Opinion for the European Patent Application No. EP22192681, mailed Jan. 27, 2023, 14 pages.

*Primary Examiner* — Hung S. Bui
(74) *Attorney, Agent, or Firm* — KDW Firm PLLC

(57) ABSTRACT

A seal for securing a cable to a fuse box includes a plastic body and a rubber insert. The plastic body has a receiving cavity along an inner surface. The rubber insert features an outside structure to join with the inner surface of the plastic body, an inside structure to surround the cable, and a fitting rib along an outside surface of the outside structure, the fitting rib to occupy the receiving cavity. The inside structure of the rubber insert moves in response to movement of the cable while the outside structure does not move.

5 Claims, 10 Drawing Sheets

(56) References Cited

FOREIGN PATENT DOCUMENTS

| | | | |
|---|---|---|---|
| JP | 2020188596 | A | 11/2020 |
| KR | 101409233 | B1 | 6/2014 |
| WO | 2014013267 | A1 | 1/2014 |
| WO | 2016057329 | A1 | 4/2016 |

* cited by examiner

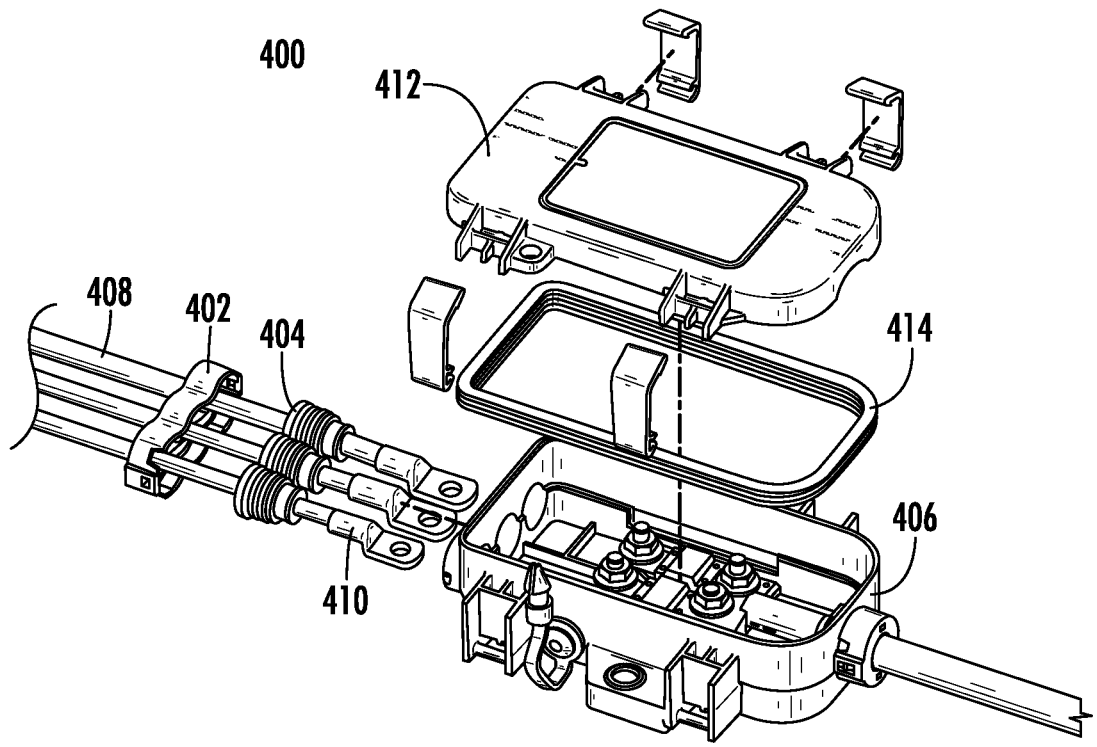
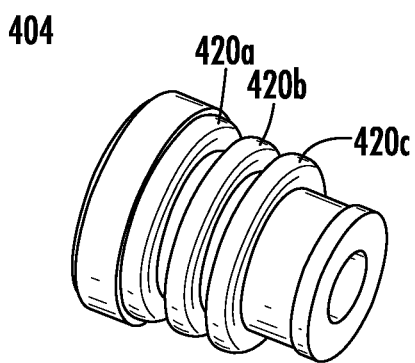
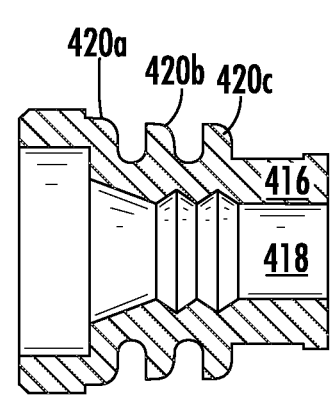
FIG. 4A
(PRIOR ART)
FIG. 4B
(PRIOR ART)
FIG. 4C
(PRIOR ART)

SNAP ON CURRENT SENSOR DESIGN

FIELD OF THE DISCLOSURE

Embodiments of the present disclosure relate to fuse boxes and, more particularly, to fuse boxes that satisfy IP67/IP69 Ingress Protection ratings.

BACKGROUND

Vehicles are equipped with a variety of electrically powered equipment which may be protected with one or more fuses. The fuses may be collected in groups and housed in fuse boxes.

The fuses are connected to other circuits within the vehicles by cables. Thus, the cables are inserted into the fuse boxes and connected to the fuses. Manufacturing a fuse box that has both IP67 (total protection from dust and protected from temporary liquid immersion) and IP69K (proven to resist ingress of high temperature and pressure wash) Ingress Protection ratings is challenging because the fuses are accessed during maintenance, and thus cannot be permanently sealed within the fuse box.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a seal in accordance with the present disclosure may include a plastic body and a rubber insert. The plastic body has a receiving cavity along an inner surface. The rubber insert features an outside structure to join with the inner surface of the plastic body, an inside structure to surround the cable, and a fitting rib along an outside surface of the outside structure, the fitting rib to occupy the receiving cavity. The inside structure of the rubber insert moves in response to movement of the cable while the outside structure does not move.

An exemplary embodiment of a fuse box assembly in accordance with the present disclosure may include a housing, a fuse, a cover, and a seal. The housing has an opening for receiving a cable. The fuse is connected to a terminal of the cable. The cover fits over the housing and seals the fuse inside the housing. The seal fits into the opening and holds the cable against the housing and prevents ingress of water or dust into the housing. The seal consists of an overmolded combination of a plastic body and a rubber insert. The plastic body features a lock mechanism to join the seal to the housing. The rubber insert features an outside structure and an inside structure, with the outside structure being connected to the plastic body and being stationary and the inside structure to surround the cable and being movable within the outside structure. The inside structure simultaneously elongates and compresses in response to movement of the cable.

An exemplary embodiment of rubber insert to be overmolded with a plastic body to form a water-tight seal in accordance with the present disclosure may include an outside structure and an inside structure. The outside structure is to be joined with an inner surface of the plastic body and is stationary. The inside structure is to circumferentially grip around a cylindrical cable. The inside structure includes a pair of ribs disposed circumferentially on an insertion side of the inside structure. The pair of ribs compress in response to insertion of the cylindrical cable. The inside structure further includes multiple grippers disposed circumferentially on a terminal side of the inside structure. The multiple grippers are movable in a space between the inside structure and the outside structure.

BRIEF DESCRIPTION OF THE DRAWINGS

FIGS. 4A-4D are diagrams illustrating a fuse box assembly, in accordance with the prior art;

DETAILED DESCRIPTION

A novel seal is disclosed herein for providing IP69 at the point at which a cable is inserted into a fuse box assembly. The seal is an overmolded part consisting of a rigid plastic body and a flexible rubber insert. The rubber insert includes several features that add surface area to its inside structure and further increase its flexibility. A portion of the rubber insert can simultaneously elongate and compress in response to movement of the cable, thus ensuring IP69 protection is maintained, even from high-pressure and/or high-temperature sprays of water.

For the sake of convenience and clarity, terms such as "top", "bottom", "upper", "lower", "vertical", "horizontal", "lateral", "transverse", "radial", "inner", "outer", "left", and "right" may be used herein to describe the relative placement and orientation of the features and components of the electrical box, each with respect to the geometry and orientation of other features and components of the electrical box appearing in the perspective, exploded perspective, and cross-sectional views provided herein. Said terminology is not intended to be limiting and includes the words specifically mentioned, derivatives therein, and words of similar import.

Figure 1:
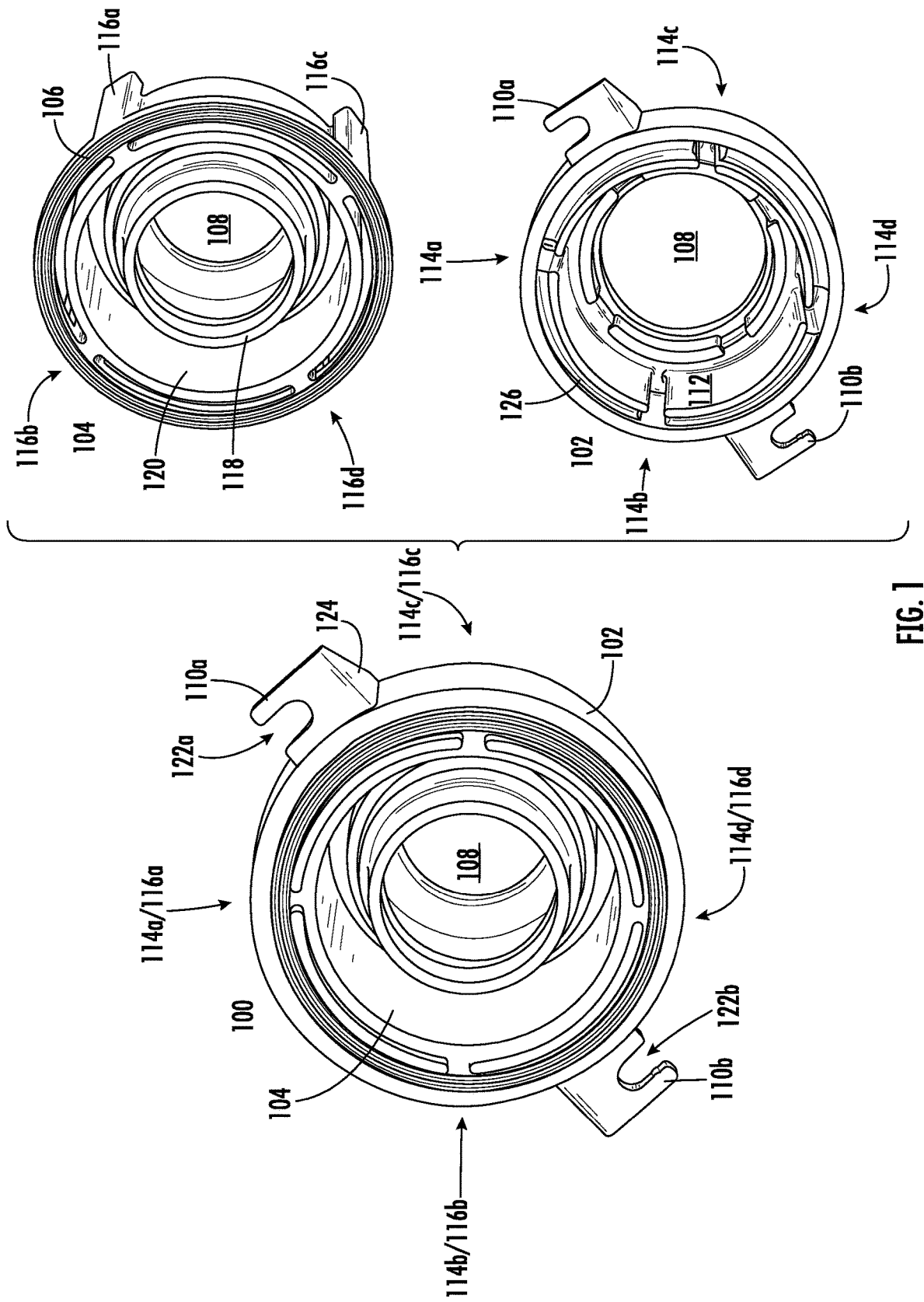
FIG. 1 is a diagram illustrating a seal for use with a fuse box, in accordance with exemplary embodiments.

FIG. 1 is a representative drawing of a seal 100 for use with a fuse box, according to exemplary embodiments. The seal 100 is an overmolded component made of a plastic material and a rubber material. Overmolding is a technique that allows the combination of multiple materials into a unitary structure. The seal 100 is thus an overmolded combination of a plastic body 102 and rubber insert 104. In exemplary embodiments, the plastic body 102 is a thermoplastic, such as PA66, and the rubber insert 104 is silicon rubber. Both the plastic body 102 and the rubber insert 104 include an opening 108 through which a cable (not shown)

is disposed, for connecting and securing the cable to a fuse box, such as the fuse box assembly 300 in FIGS. 3A-B, below.

In exemplary embodiments, the plastic body 102 includes an inner surface 112 for receiving the rubber insert 104 while the rubber insert includes an inside structure 118 and an outside structure 120. The inner surface 112, the inside structure 118, and the outside structure 120 are substantially cylindrical in shape. In exemplary embodiments, the inner surface 112 is further shaped such that the outside structure 120 of the rubber insert 104 fits snugly into the inner surface of the plastic body 102.

The plastic body 102 features two lock mechanisms 110a and 110b (collectively, "lock mechanism(s) 110") for securing the seal 100 against the housing of a fuse box. Lock mechanism 110a includes an opening 122a and lock mechanism 110b includes an opening 122b (collectively, "openings 122"). Although two lock mechanisms are shown, the plastic body 102 includes a single lock mechanism, in one embodiment. Only visible for the lock mechanism 110a, a corner piece is disposed orthogonal to the opening 122, which stabilizes the opening, in some embodiments. The openings 122 are designed to clasp with respective engagement mechanisms of a fuse box assembly. The lock mechanism 110 is described in more detail in conjunction with FIG. 5, below.

The plastic body 102 also includes receiving cavities 114a-d (collectively, "receiving cavities 114") disposed along the inner surface 112 while the rubber insert 104 includes fitting ribs 116a-d disposed on an outside surface of the outside structure 120 (collectively, "fitting ribs 116"). Although the plastic body 102 features four receiving cavities 114 and the rubber insert 104 features four fitting ribs 116, the seal 100 may include more or fewer receiving cavities and respective fitting ribs. Because the seal 100 is an overmolded part, the fitting ribs 116 of the rubber insert 104 occupy respective receiving cavities 114 of the plastic body 102. The rubber insert 104 further includes a ring 106 for fitting the rubber insert with the plastic body 102. In exemplary embodiments, the ring 106 is connected to each of the fitting ribs 116. The ring 106 is discussed in more detail in FIGS. 2A-2D.

The International Electrotechnical Commission promulgates Ingress Protection (IP) ratings to classify the sealing effectiveness of electrical enclosures from foreign matter such as water and dust. The IP rating is a two-digit number, where the first digit pertains to ingress of solids and the second digit pertains to the ingress of water. Having an IP rating of "6" in the first digit indicates that the enclosure is "dust tight", that is, no dust will enter the enclosure. An IP rating of "9" in the second digit indicates protection from close-range water pressure as well as high temperature water. In exemplary embodiments, the seal 100 used to connect or couple a cable to an electrical box, provides IP69 protection of the box from ingress of both dust and water, even high-pressure and high-temperature water. The seal 100 may therefore be useful in applications in the automotive industry.

Figure 2A:
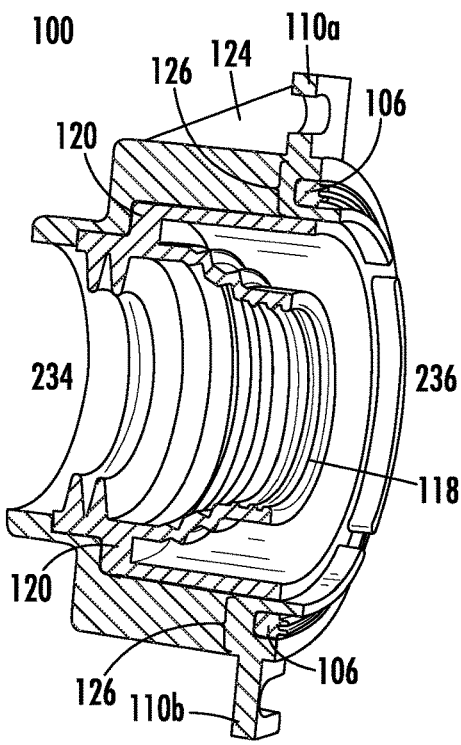
FIG. 2A-2D are diagrams illustrating the seal of FIG. 1, in accordance with exemplary embodiments.
Figure 2B:
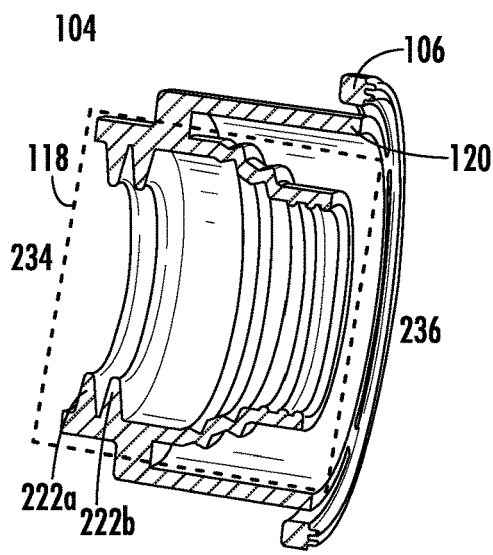
Figure 2C:
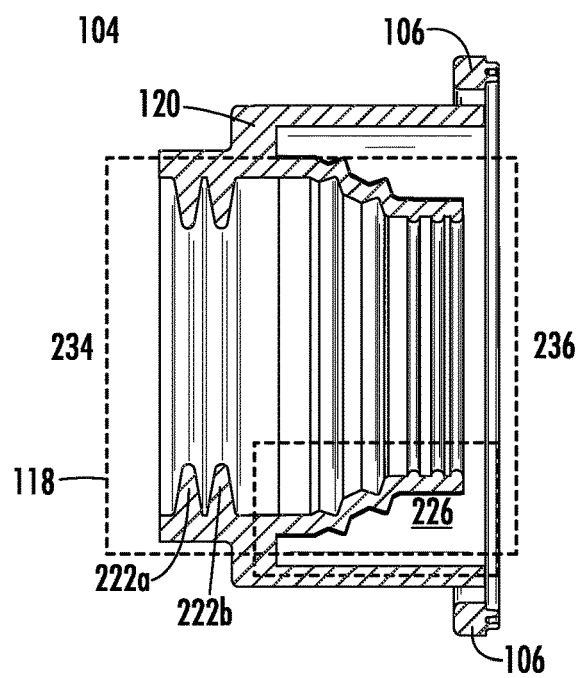
Figure 2D:
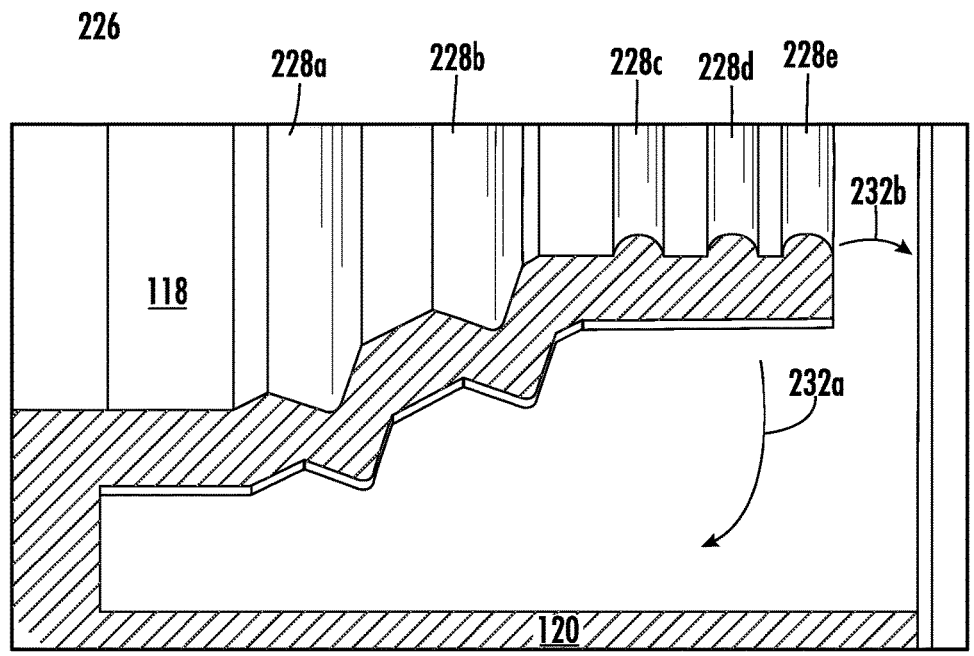

FIGS. 2A-2D are representative drawings of the seal 100 of FIG. 1, along with further detail about the rubber insert 104, according to exemplary embodiments. FIG. 2A is a perspective cutaway view of the seal 100; FIG. 2B is a perspective cutaway view of the rubber insert 104; FIG. 2C is a side cutaway view of the rubber insert 104; and FIG. 2D is a detailed view of a portion of the inside structure 118. In describing the components of the overmolded seal 100, particularly the plastic body 102 and the rubber insert 104 components, reference is made to an insertion side 234 and a terminal side 236. The insertion side 234 is the side of the seal 100 from which the cable will be inserted through the seal. The terminal side 236 is the side of the seal 100 closer to the terminal of the cable (see, e.g., FIG. 3A). Both the insertion side 234 and the terminal side 236 are indicated in FIGS. 2A-2D.

In FIG. 2A, the plastic body 102 of the seal 100 is shown along with the locking mechanisms 110, with another view of the corner piece 124 being visible for the lock mechanism 110a. In exemplary embodiments, the lock mechanism 110 is located on the terminal side 236 of the plastic body 102. In exemplary embodiments, the corner piece 124 is perpendicular to the circumferential edge of the plastic body 102 while the lock mechanism 110 is orthogonal to the corner piece. Inside the plastic body 102, the ring 106, the inside structure 118, and the outside structure 120 of the rubber insert 104 are visible, where the ring 106 is on the terminal side 236 of the rubber insert. In exemplary embodiments, also on the terminal side 236, the plastic body 102 further includes a receiving groove 126 shaped so that the ring 106 of the rubber insert 104 fits therein.

In exemplary embodiments, the rubber insert 104 is fixed with wire (not shown) to ensure a good seal with the cable. Nevertheless, the rubber insert 104 is elastic and flexible enough to move in response to movement of the cable once inserted in the seal 100. In FIGS. 2B and 2C, the inside structure 118 of the rubber insert 104 is outlined with a dashed rectangle. The outside structure 120 is connected to the ring 106. Also visible in FIG. 2A, there exists some space between the inside structure 118 and the outside structure 120 of the rubber insert 104. In exemplary embodiments, this space allows the inside structure 118 to move somewhat within the outside structure 120 while the outside structure stays stationary within the plastic body 102. The flexibility of the inside structure 118 thus enables movement of the cable once inserted through the seal 100 while the rigidity of the outside structure helps to maintain the integrity of the seal within the opening of a fuse box. In contrast to prior art seal mechanisms, the movement of the cable with the seal 100 will not allow ingress of materials such as dust and water into the fuse box to which the cable is connected.

In exemplary embodiments, the inside structure 118 of the rubber insert 104 includes ribs 222a and 222b (collectively, "ribs 222"), located on the insertion side 234, as well as a gripper section 226 of additional surfaces, located on the terminal side 236. The gripper section 226 is outlined at the bottom of FIG. 2C, and, because the gripper section 226 and the ribs 222 are circumferentially disposed around the inside structure 118 of the rubber insert 104, both features are also shown at the top of the inside structure. The gripper section 226 is shown in more detail in FIG. 2D. Both the ribs 222 and the gripper section 226 increase the surface area and add flexibility to the inside structure 118 of the rubber insert 104. In exemplary embodiments, the gripper section 226 of the inside structure 118 of the rubber insert 104 is designed to either elongate or compress in response to movement of the cable being connected by the seal 100.

The gripper section 226 features grippers 228a-e formed along the inner surface of the inside structure 118 (collectively, "grippers 228"). Both the ribs 222 and the grippers 228 are circumferentially disposed around the entire inside surface of the inside structure 118 and thus fit tightly and circumferentially against the cable inserted into the seal 100. In some embodiments, as illustrated in FIG. 3B, below, the ribs 222 and grippers 228 overlap with the cable, with the ribs 222 connecting with the cable at the insertion side 234 and the grippers connecting with the cable at the terminal side 236. The inside structure 118 of the rubber insert 104 thus creates a tight seal against the cable, in some embodiments, ensuring that no dust or water can get into the fuse box.

In exemplary embodiments, the gripper section 226 of the inside structure 118 is elastic and thus able to move within the outside structure 120, while the outside structure remains stationary. This is useful if the cable being held by the seal 100 moves. Spaces 232a and 232b are shown, which are spaces between the inside structure 118 and the outside structure 120 (collectively, "spaces 232"). The spaces 232 enable the inside structure 118 to elongate or compress in response to movement of the cable inside the seal 100. The space 232a particularly shows that there is considerable movement available within the inside structure 118 such that contact with the outside structure 120 of the rubber insert 104 is avoided, in some embodiments. This ensures that the outside structure 120 will remain stationary while the inside structure 118 is able to compress and elongate in response to movement of the cable, in exemplary embodiments.

Figure 3A:
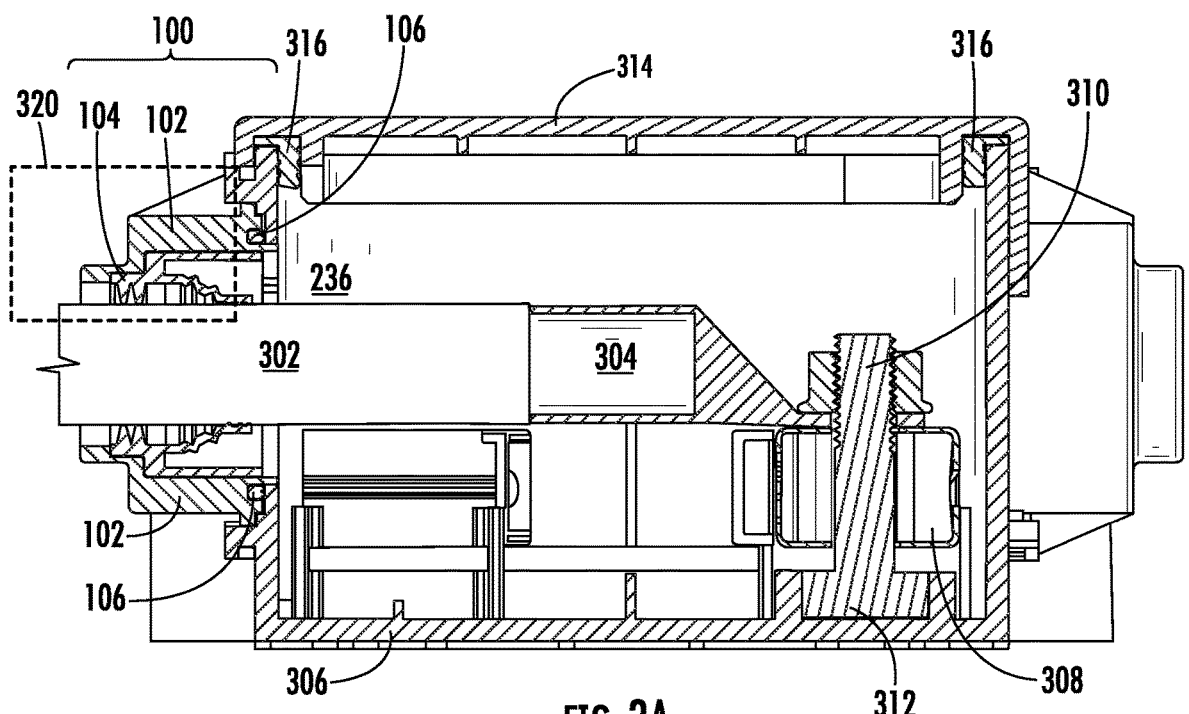
FIGS. 3A-F are diagrams illustrating a fuse box assembly using the seal of FIG. 1, in accordance with exemplary embodiments.
Figure 3B:
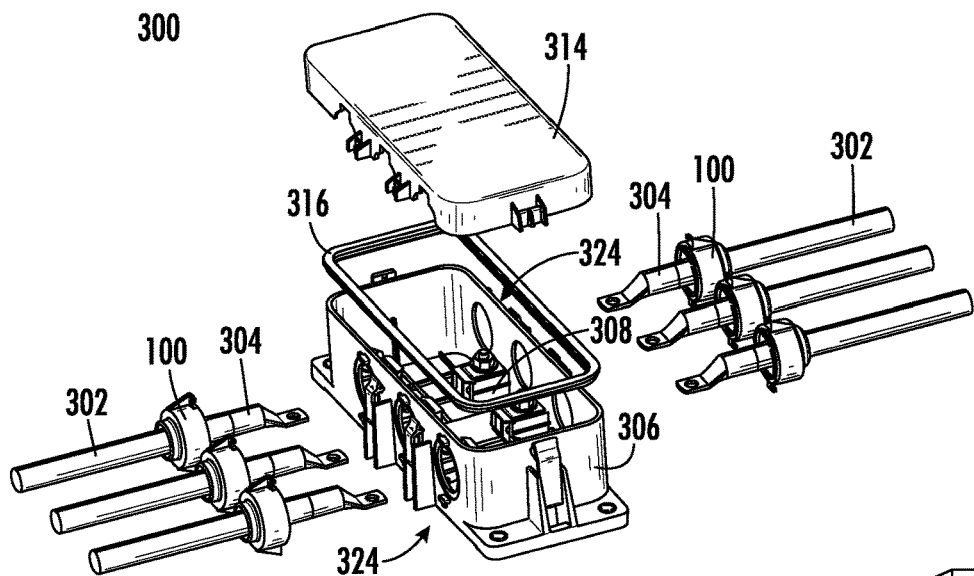
Figure 3C:
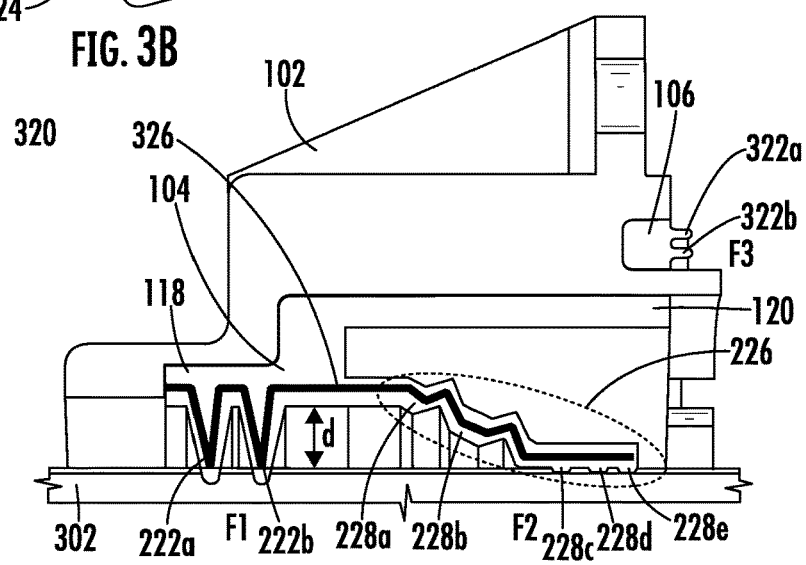
Figure 3D:
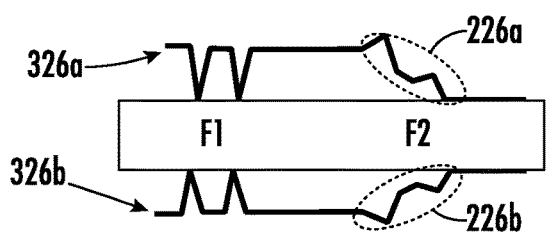
Figure 3E:
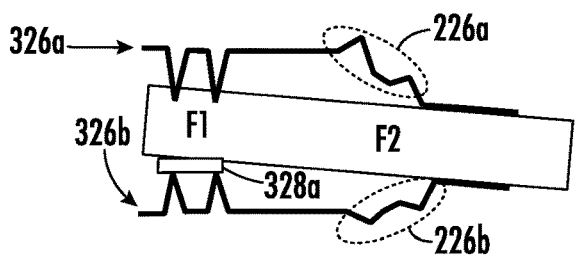
Figure 3F:
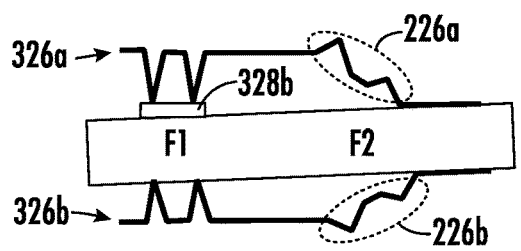

FIGS. 3A-3F are representative drawings of a fuse box assembly including the seal 100 of FIG. 1, according to exemplary embodiments. FIG. 3A is a side cutaway view of the fuse box assembly 300 with the seal 100; FIG. 3B is a perspective exploded view of the fuse box assembly 300; FIG. 3C is a side cutaway view of an inset of the fuse box of FIG. 3A; and FIGS. 3D-3F are side views showing response of the seal to cable movement.

The fuse box assembly 300 features a cable 302 and terminal 304 to be connected to a fuse 308 using a screw bolt 312 and nut 310. This arrangement enables an electrical connection to be established between the fuse 308 and the circuit to which the cable 302 is attached. The fuse box assembly 300 further includes a housing 306 and a cover 314, which is connected to the housing by a gasket 316. The exploded view of FIG. 3B shows that the gasket, made from a rubber or other elastomeric material, is arranged circumferentially between the housing 306 and the cover 314, both of which are made of a harder, plastic material. The housing 306 includes openings 324 through which the cables 302 are inserted to connect to respective fuses 308.

As illustrated in the side cutaway view of FIG. 3A, the seal 100, including the plastic body 102 and the rubber insert 104, surrounds the cable 302 to hold the cable in place against the housing 306 in the fuse box assembly 300. Although the terminal 304 of the cable 302 is connected to the fuse 308 using the screw bolt 312 and nut 310, the seal 100 provides additional insurance that the cable 302 will remain in place in the fuse box assembly 300. Further, in exemplary embodiments, the seal 100 also prevents ingress of water or dust into the housing 306, thus protecting the fuse 308.

An inset 320 of the seal 100 is denoted with a dashed rectangle and is further illustrated in FIG. 3C. A gradient 326 of the inside structure 118 of the rubber insert 104 is shown, with the ribs 222 being disposed the insertion side 234 and the grippers 228 on the terminal side 236. The ribs 222a and 222b, as well as grippers 228c, 228d, and 228e overlap somewhat with the cable 302, indicating that the inside structure 118 of the rubber insert 104 tightly grips the cable when the cable is inserted, in some embodiments. Further, in some embodiments, the rubber insert 104 of the seal 100 is behind the opening of the housing 306, preventing even high-pressure water from getting into the fuse box assembly 300.

Considering that the fuse box assembly 300 may be a component under the hood of a vehicle, as one example, the cable 302 may become bent or off-center in the assembly, causing the gripper section 226 of the inside structure 118 to move. Events such as movement following assembly and normal vehicle use (e.g., driving) may cause the cable 302 to move. Where the cable 302 becomes bent or in an off-center position, the grippers 228a and 228b may also touch the cable. The inset 320 thus shows that the inside structure 118 features several structures that, given any position of the cable 302, will alternatively elongate or compress to maintain contact with the cable, thus protecting the inside of the fuse box assembly 300 from ingress of dust, water, grease, or other foreign objects. Put another way, the design of the rubber insert 104 of the seal 100 ensures that gaps between the seal and the cable 302 do not occur, in some embodiments.

In FIGS. 3C-3F, protective positions are denoted by F1, F2, and F3, respectively. In exemplary embodiments, the inside structure 118 of the rubber insert 104 is designed like a spring that can both elongate and compress, in response to movement of the cable 302. Being cylindrical in shape, the cable 302 can move in all directions, as there are up to 360° of movement from the original insertion position, not simply upward or downward positions. Similarly, the seal 100 is cylindrical in shape and able to respond to movement of the cable 302 in all directions. Nevertheless, FIGS. 3D-3F are provided to illustrate how the seal 100 responds to movement of the cable. The cable 302 is shown in three positions relative to the position of the cable at insertion: unmoved (FIG. 3D), moved in an upward direction (FIG. 3E), and moved in a downward direction (FIG. 3F). From these positions, it is possible to imagine the response of the seal 100 to movement of the cable 302 in any direction.

Since the illustration of FIG. 3C is a side cutaway view showing just a top portion of the cable 302, a single "slice" of the gradient 326 is indicated. Additionally, the gripper section 226 of the gradient 326 is circled, as this is the portion of the seal that elongates and compresses in response to cable movement, in exemplary embodiments. The seal 100 surrounds the cable 302 and thus the gradient 326 also surrounds the cable 302. FIGS. 3D, 3E, and 3F show "two slices" of the gradient 326, indicated as gradient 326a and gripper section 226a (top of cable 302) and gradient 326b and gripper section 226b (bottom of cable).

In FIG. 3D, the cable 302 is in its insertion position and is unmoved. The ribs 222 of the gradient 326 (F1 position) touch the cable 302 both on top (gradient 326a) and on bottom (gradient 326b) while neither the gripper section 226a (top of cable 302) nor the gripper section 226b (F2 position) touch the cable on either the top or the bottom of the cable. Further, the gripper sections 226a and 226b do not move, in some embodiments, when the cable is unmoved from its insertion position.

In FIG. 3E, the cable 302 moves upward, which both pushes against the ribs 222 of gradient 326a and creates a space 328a between the ribs of gradient 326b (F1 position). The space 328a creates a risk for ingress of water, dust, and other foreign materials, below the cable 302, into the fuse box assembly 300. In exemplary embodiments, the gripper section 226a above the cable 302 elongates while the gripper section 226b below the cable compresses (F2 position). Recall from FIG. 2D that there exists spaces 232 between the inside structure 118 and the outside structure 120 of the rubber insert 104. The compression of the gripper section 226b prevents ingress of contaminants underneath the cable 302, in some embodiments. Further, because the gripper sections 226a and 226b are opposing sides of the inside structure 118, the elongation of the gripper section 226a facilitates the ability of the gripper section 226b to compress, in some embodiments.

FIG. 3F shows the cable 302 moving in a downward direction, which both pushes against the ribs 222 of gradient 326b and creates a space 328b between the ribs of gradient 326a (F1 position). In exemplary embodiments, the gripper section 226b below the cable 302 elongates while the gripper section 226a above the cable compresses (F2 position). As two sides of the same cylindrical piece of the rubber insert 104, the gripper sections 226a and 226b work together to prevent ingress of foreign matter in response to movement of the cable 302. Thus, position F1 and position F2 work together to provide an overlap design for sealing the cable 302 inside the fuse box assembly 300. The design of the rubber insert 104 allows simultaneous elongation on one side and compression on an opposing side of the gripper section 226, in some embodiments.

In exemplary embodiments, the rubber insert 104 further enables different sizes of cables to be used with the fuse box assembly 300. The ribs 222 are flexible enough to allow some overlap with the cable. Thus, once inserted, a tight seal is formed between the ribs 222 and the cable. Further, as shown in FIG. 3C, there is a distance, d, between the inside structure 118 and the cable 302. It has already been shown in FIG. 2D that there is enough space 232 for the gripper section 226 of the gradient 326 to move. Larger cables tend to be made of a more rigid material and thus tend to be less flexible than smaller cables. Nevertheless, the overmolded seal 100 is operable with a relatively inflexible and larger cable, in exemplary embodiments, and the IP69 protection is maintained, whatever the cable size.

In exemplary embodiments, the ring 106 of the rubber insert 104 features ring rib 322a and ring rib 322b (collectively, "ring ribs 322"). The ring ribs 322 add both surface area and flexibility to the ring 106, in some embodiments. When the seal 100 is inserted into the opening 324 of the housing 306, the ring ribs 322 are pushed flush against the housing. Where the housing 306 is made of a harder plastic material and the rubber insert 104 is made of a softer rubber material, the ring ribs 322 facilitate a tight connection between the seal 100 and the housing 306. Thus, like the ribs 222 and the grippers 228, the ring ribs 322 are designed to maintain an impenetrable seal to the housing 306 of the fuse box assembly 300 (see also FIG. 3A). By preventing water ingress into the housing 306 along the gap between the seal 100 and the housing, the position F3 provides IP69 protection that supplements that of position F1 and position F2 for the fuse box assembly 300, in exemplary embodiments.

Figure 4D:
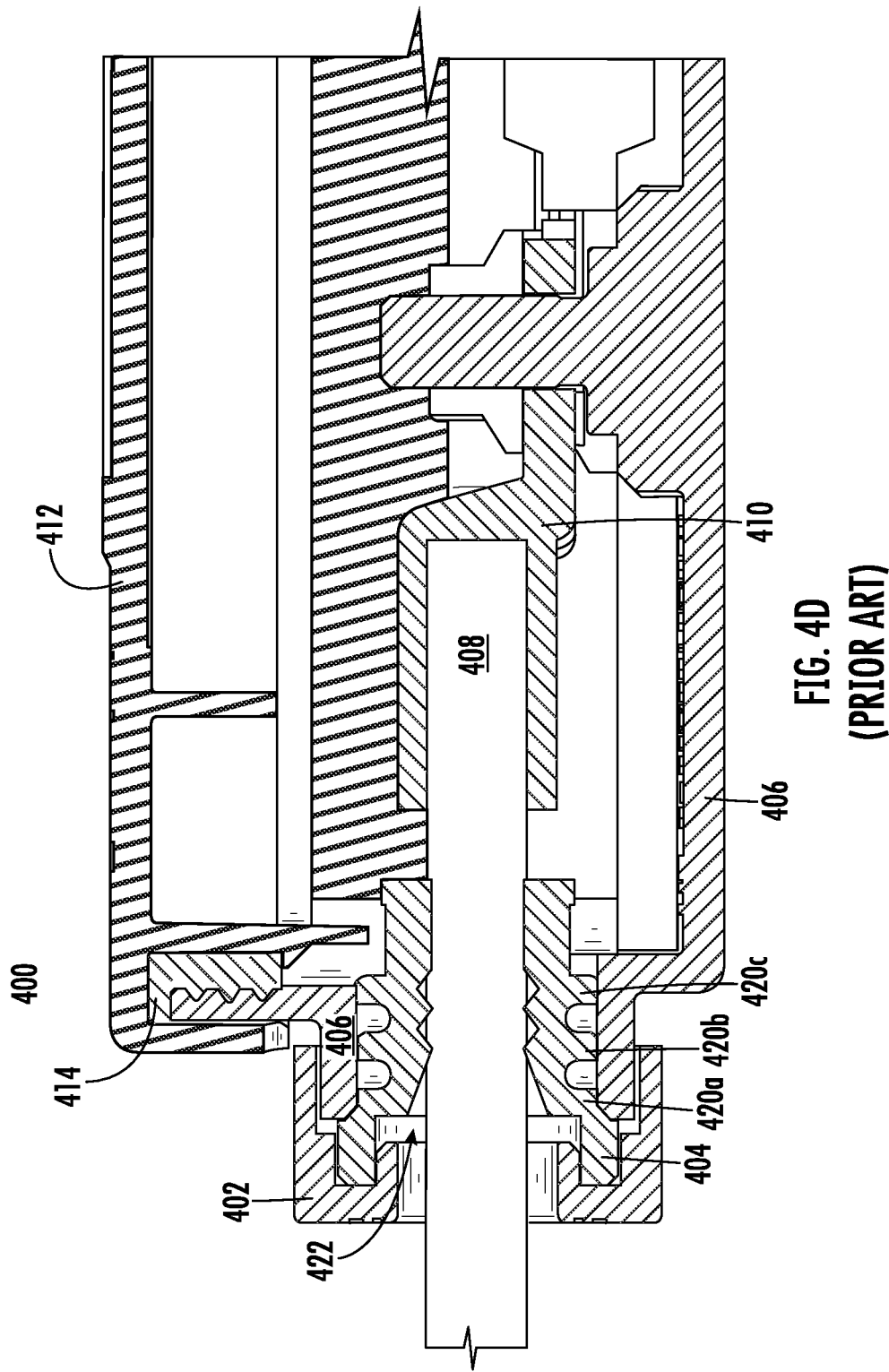

FIGS. 4A-4D are representative drawings of a fuse box assembly including a legacy seal design, according to the prior art. FIG. 4A is an exploded perspective view of a fuse box assembly 400 with a prior art cap assembly 402 and cap seal 404; FIG. 4B is a perspective view of the prior art cap seal 404; FIG. 4C is a side cutaway view of the cap seal 404; and FIG. 4D is a side cutaway view of the prior art fuse box assembly 400.

The fuse box assembly 400 is able to receive three cables 408, each including a dedicated terminal 410, entering from the left side of a housing 406. The cables 408 are connected to the housing 406 using a cap assembly 402 consisting of three caps, one for each cable, and three separate cap seals 404. Like the fuse box assembly 300, the fuse box assembly 400 also includes a cover 412 which is secured to the housing 406 by a cover gasket 414. The cover gasket 414, made from a rubber or other elastomeric material, is arranged circumferentially between the housing 406 and the cover 412, both of which are a harder, plastic material.

The cap seal 404 is designed based on an interference fit in which there is an overlap between the cable 408 and the cap seal. This design is used for small size cables, as the seal is soft without any gaps between the cable 408 and the cap seal 404. Unfortunately, an ingress of water, dust, and other foreign matter into the fuse box assembly 400 may occur if a larger cable is used because the larger cable is not as flexible as the smaller one. Also, the larger cables tend to be harder than the smaller ones. Also, using the prior art cap seal 404, an ingress of foreign materials into the fuse box assembly 400 may occur once the cable is off-center. For example, if the cable is bent during assembly or while in use, such as when a vehicle is being driven, the prior art cap seal 404 does not protect the fuse box assembly 400 against ingress of foreign materials.

As illustrated in the perspective view (FIG. 4B) and the side cutaway view (FIG. 4C), the cap seal 404 includes three concentric rings 420a-c (collectively, "concentric rings 420") that form an exterior portion 416 of the cap seal, with the interior portion 424 being the receiving chamber for the cable 408. The interior portion 424 lacks any surface structures, such as the ribs 222 or grippers 228 found in the rubber insert 104 of the novel seal 100. Further, the structures of the prior art cap seal 404 do not enable elongation of the structures on one side with simultaneous compression on the opposing side seal, as occurs with the novel seal 100 in response to cable movement.

As shown in FIG. 4A, each cable 408 is fitted with the cap seal 404, then the cap assembly 402 before being inserted through respective openings of the housing 406. In the side cutaway view of FIG. 4B, the cap assembly 402 and cap seal 404 are shown, with the cap seal being partially inside the housing 406 and surrounding the cable 408. The cap assembly 402 is partially disposed over the housing 406. The concentric rings 420 press against the housing 406 while the interior portion 418 of the cap seal 404 surrounds the cable 408. At an end 422 farthest from the terminal 410, the cap seal 404 is not even touching the cable 408.

When the cable 408 becomes bent, as indicated by the dashed dotted line, the cap seal 404 is unable to compensate for the cable movement, as occurs with the seal 100. Instead, dust, dirt, and water can enter the chamber of the fuse assembly 400, which may affect operation of the fuses inside. Because dust and water, even at high speed and high temperature are present in automotive applications, the prior art cap seal 404 does not provide IP69 protection of the components in the fuse box assembly 400.

Figure 5:
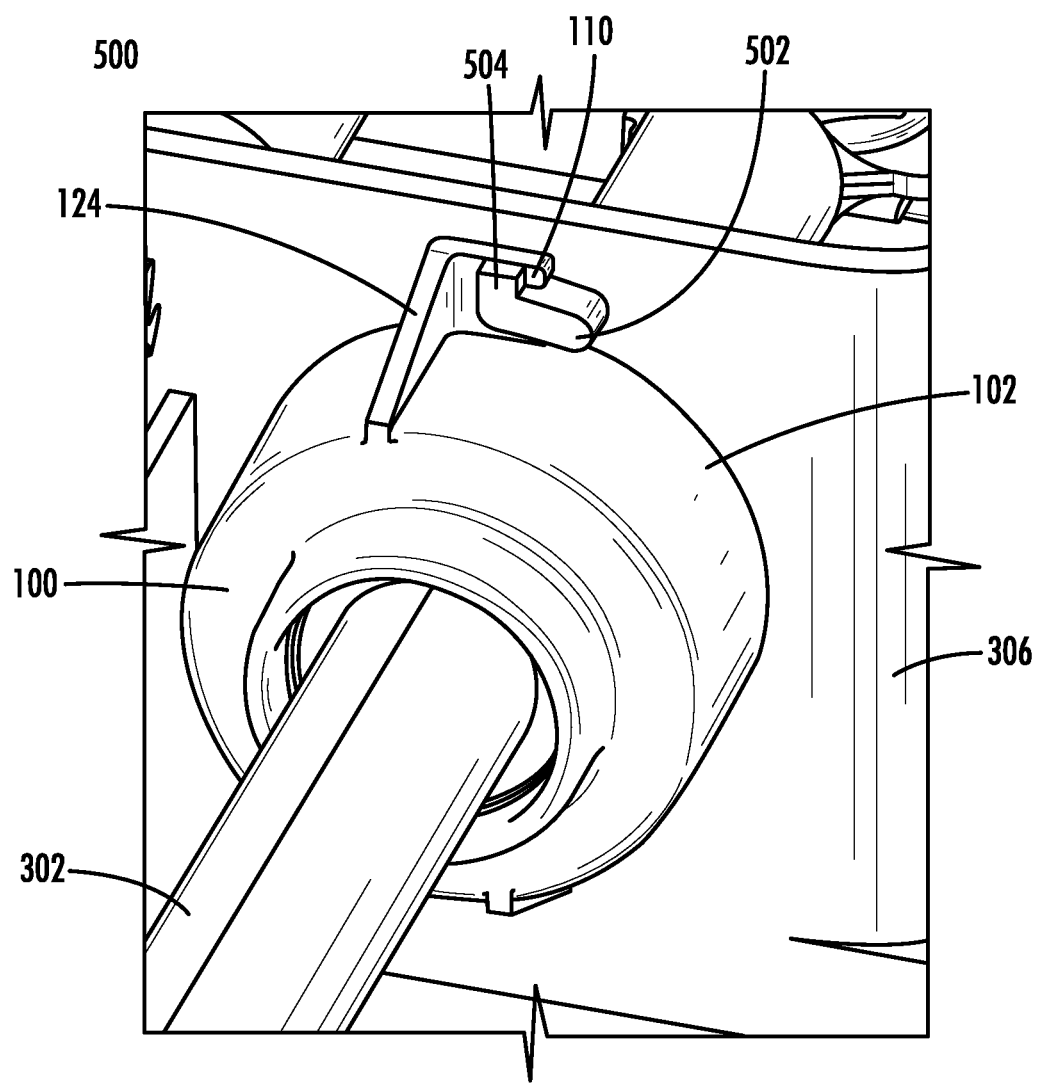
FIG. 5 is a diagram illustrating a locked seal assembly used by the seal of FIG. 1, in accordance with exemplary embodiments.

FIG. 5 is a representative drawing of a lock seal assembly 500 used to secure the seal 100 to the fuse box assembly 300, according to exemplary embodiments. The seal 100 and cable 302 are shown as before, and a portion of the housing 306 is visible. The housing 306 includes an engagement mechanism 502 and a lip 504, which are either attached or affixed to the housing 306 or formed as a unitary part of the housing, such as by injection molding. Recall from the depiction of the seal 100 (FIGS. 1 and 2A) that the lock mechanism 110 extends radially outward from the circumferential surface of the plastic body 102 and includes a corner piece 124 that is orthogonal to the lock mechanism piece.

Once the cable is inserted into the housing 306 of the fuse box, the seal 100 will be placed flush against the housing, taking care that the lock mechanism 110 is to the side of the engagement mechanism 502. In the illustration of FIG. 5, for example, the lock mechanism 110 would be to the left of the engagement mechanisms 502. The plastic body 102 is rotated against the housing 306 until the lock mechanism 110 engages with and is latched to the engagement mechanism 502.

Figure 6A:
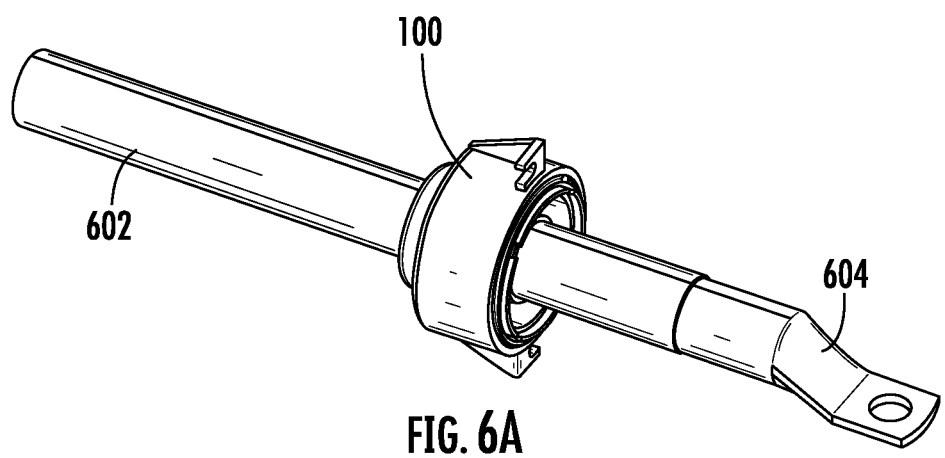
FIGS. 6A-6B are diagrams illustrating two cables secured using the seal of FIG. 1, in accordance with exemplary embodiments.
Figure 6B:
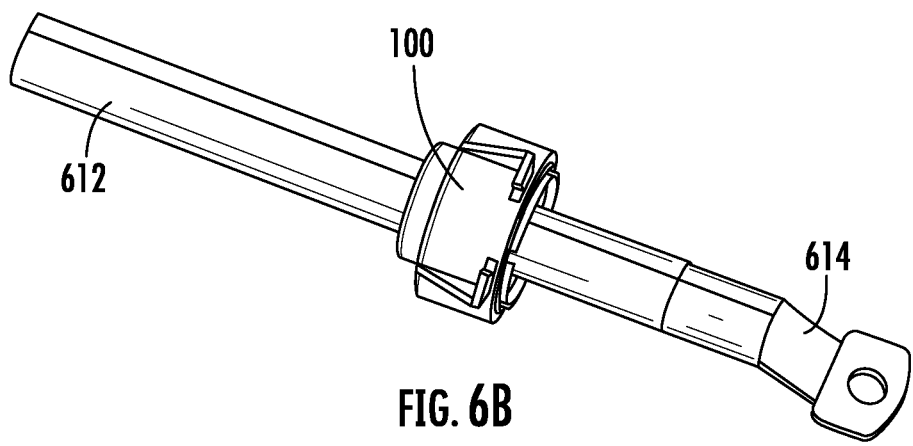

FIGS. 6A and 6B are representative drawings of cable assemblies that are supported by the novel seal 100, according to exemplary embodiments. FIG. 6A is a perspective view of a cable assembly 600 having a small terminal; FIG. 6B is a perspective view of a cable assembly 610 having a large terminal. In exemplary embodiments, the novel seal 100 may be used with cables having two different sized terminals.

The cable assembly 600 in FIG. 6A includes a small terminal 604 connected to cable 602. The cable assembly 610 in FIG. 6B includes a larger terminal 614 connected to cable 612. In some embodiments, cables 602 and 612 are the same size. The larger terminal 614 of is slightly wider at the end distal to the cable 612 whereas the distal end of the small terminal 604 is about the same width as the rest of the terminal. The seal 100 can be used with either the cable assembly 600 or the cable assembly 610. However, the addition of the seal 100 to each cable is slightly different, as illustrated in FIGS. 7 and 8.

Figure 7:
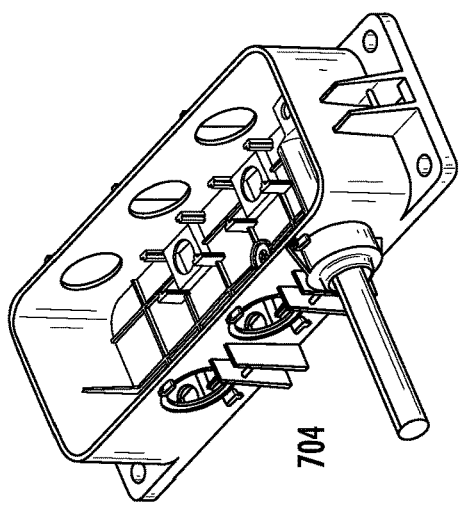
FIG. 7 is a diagram illustrating process steps for attaching a cable with a small terminal to a fuse box using the seal of FIG. 1, in accordance with exemplary embodiments.
Figure 7:
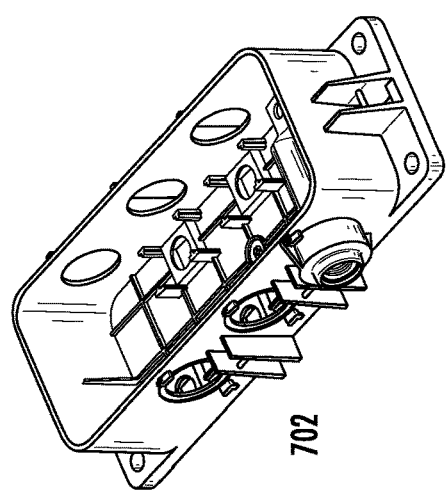
Figure 7:
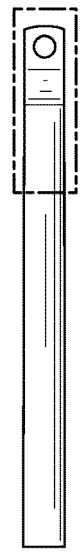
Figure 7:
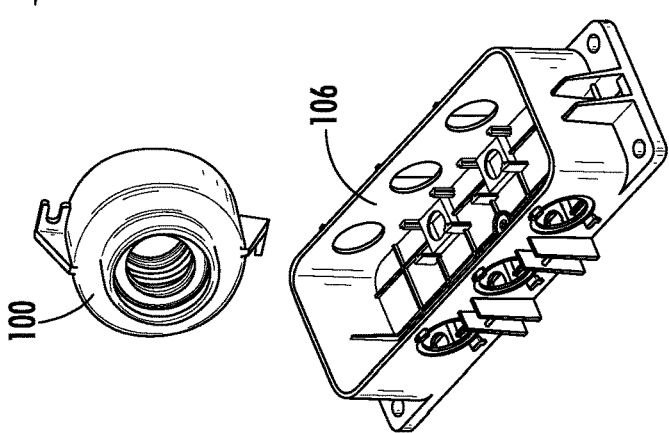

FIG. 7 includes representative drawings of the process steps for adding the seal 100 (FIG. 1) to the cable assembly 600 (FIG. 6A), according to exemplary embodiments. At the left side of FIG. 7, the seal 100 and the housing of the fuse box assembly 300 (FIG. 3) are shown. The seal 100 is inserted into an opening of the housing 306, resulting in a housing with the seal attached 702. Because the cable assembly 600 has a small terminal, the terminal can fit through the opening of the seal 100. Thus, the cable assembly 600 with the small terminal is inserted through the seal 100 and into the housing 306, resulting in a housing 704 with the small terminal attached with the seal.

Figure 8:
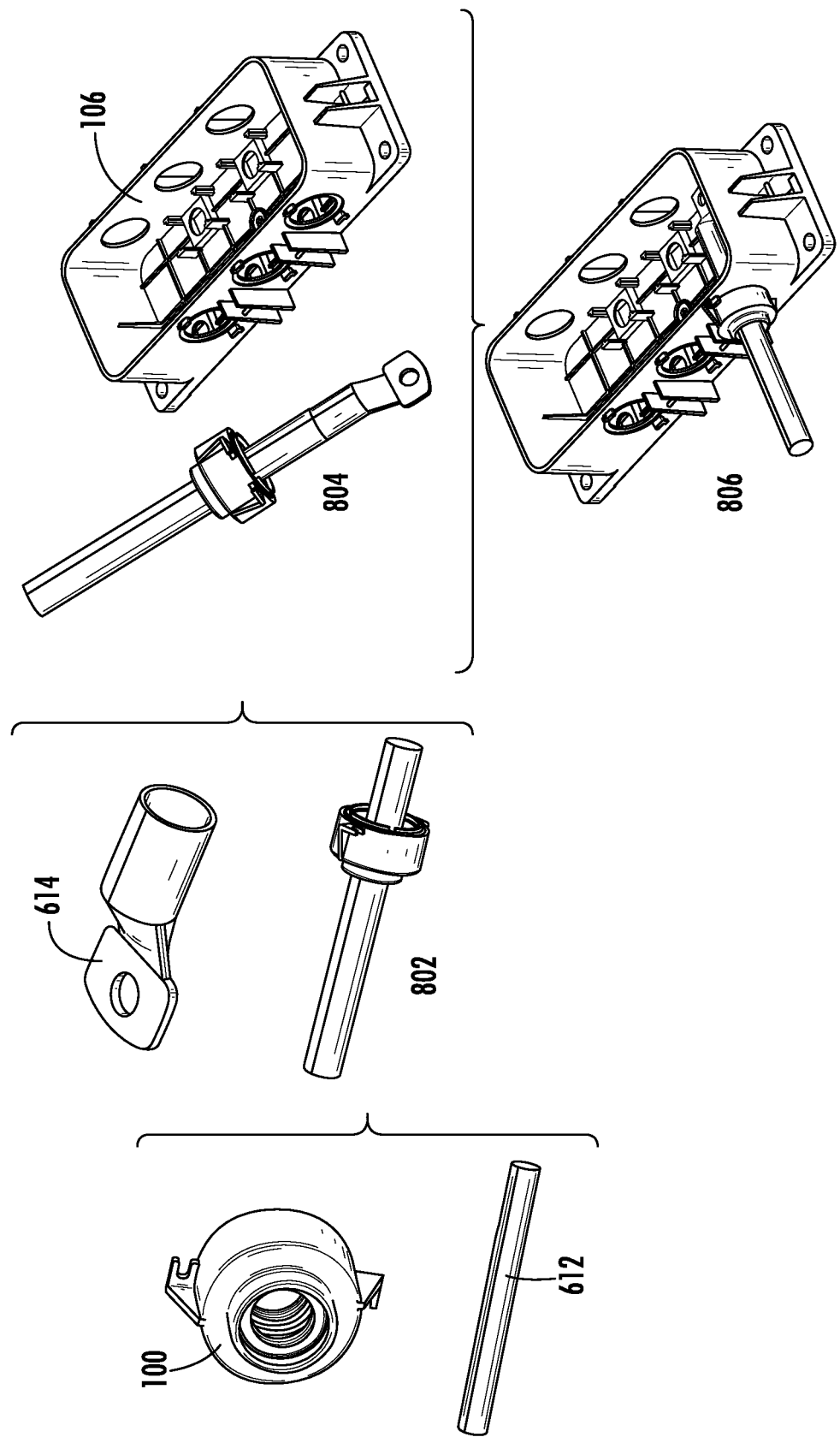
FIG. 8 is a diagram illustrating process steps for attaching a cable with a large terminal to a fuse box using the seal of FIG. 1, in accordance with exemplary embodiments.

FIG. 8 includes representative drawings of the process steps for adding the seal 100 (FIG. 1) to the cable assembly 610 (FIG. 6B), according to exemplary embodiments. At the left side of FIG. 7, the seal 100 and the cable 612 (FIG. 6B) are shown, where the cable is not yet attached to the large terminal 614. The cable 612 is inserted through the opening of the seal 100, resulting in a cable with seal attached 802. The large terminal 614 is then attached to one end of the cable with seal attached 802, resulting in a cable with seal and large terminal 804. The cable with seal and large terminal 804 is then fed into an opening of the housing 306, with the large terminal 614 fitting through the opening. The seal 100 is then secured to the housing 306, resulting in housing with large terminal attached with seal 806. Thus, whether the cable uses a smaller terminal or larger one, the assembly of the cable to the fuse box housing is easy for the customer.

The disclosed seal 100 uses an overmolded plastic body with a rubber insert to provide IP69 protection to the fuse box assembly, forming a water-tight seal which prevents the ingress of dust, dirt, and water, even at high pressure and high temperature. The elastic design of the seal 100 maintains the IP69 protection even when the cable is in an off-center position. Further, in exemplary embodiments, the plastic body protects the rubber insert so that it lasts longer and avoids cracking, as the rubber insert is protected from exposure to the foreign matter and particularly protected from high-pressure and/or high-temperature exposure to water. The overmolded seal 100 is easy to use for the customer and facilitates the addition of cables to and the removal of cables from the fuse box assembly. In addition to the fuse box assembly shown and described herein, the overmolded seal 100 can be adapted to other electrical boxes housing electronic equipment, such as power distribution modules.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A seal to couple a cable to a fuse box, the seal comprising:
   a plastic body comprising a receiving cavity disposed along an inner surface; and
   a rubber insert comprising:
      an outside structure to join with the inner surface;
      an inside structure to surround the cable;
      a fitting rib disposed along an outside surface of the outside structure, the fitting rib to occupy the receiving cavity;
      a rib disposed circumferentially on an insertion side of the inside structure, the rib to overlap with the cable;
   a ring disposed circumferentially around the outside structure and coupled to the fitting rib;
   one or more ring ribs extending from the ring toward the fuse box, wherein the one or more ring ribs fit tightly against a surface of the fuse box; and
      a gripper section disposed circumferentially on a terminal side of the inside structure, the gripper section to overlap with the cable, wherein the gripper section comprises first, second, and third grippers, the rib, the first gripper, the second gripper, and the third gripper to form a gradient that provides IP69 protection of the fuse box;
   wherein the inside structure of the rubber insert moves in response to movement of the cable while the outside structure does not move.

2. The seal of claim 1, wherein the plastic body and the rubber insert are overmolded to form a unitary structure.

3. The seal of claim 1, the plastic body further comprising a lock mechanism disposed along a circumferential edge.

4. The seal of claim 1, further comprising:
   second, third, and fourth receiving cavities; and
   second, third, and fourth fitting ribs;
   wherein the second fitting rib occupies the second receiving cavity, the third fitting rib occupies the third receiving cavity, and the fourth fitting rib occupies the fourth receiving cavity.

5. The seal of claim 1, wherein the gripper section simultaneously elongates on one side of the cable and compresses on an opposing side of the cable in response to movement of the cable while the outside structure does not move.

* * * * *

UNITED STATES PATENT AND TRADEMARK OFFICE
CERTIFICATE OF CORRECTION

Page 1 of 1

PATENT NO. : 12,409,797 B2
APPLICATION NO. : 17/899878
DATED : September 9, 2025
INVENTOR(S) : Rex Liu et al.

It is certified that error appears in the above-identified patent and that said Letters Patent is hereby corrected as shown below:

On the Title Page

Under Item (65), please insert Item (30), foreign priority application number to read as follows:
--202111063563.1 CN 2021-09-10--

Signed and Sealed this
Fourth Day of November, 2025

John A. Squires
*Director of the United States Patent and Trademark Office*